US012283539B2

(12) United States Patent
Matsutaka et al.

(10) Patent No.: US 12,283,539 B2
(45) Date of Patent: Apr. 22, 2025

(54) SEMICONDUCTOR DEVICE (71) Applicant: Mitsubishi Electric Corporation, Tokyo (JP)

(72) Inventors: Yuki Matsutaka, Tokyo (JP); Hitoshi Makishima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 415 days.

(21) Appl. No.: 17/806,205

(22) Filed: Jun. 9, 2022

(65) Prior Publication Data

US 2023/0063024 A1    Mar. 2, 2023

(30) Foreign Application Priority Data

Sep. 2, 2021 (JP) ................. 2021-143130

(51) Int. Cl.
*H01L 23/498* (2006.01)
*H01L 23/367* (2006.01)
(Continued)

(52) U.S. Cl.
CPC ...... *H01L 23/49838* (2013.01); *H01L 23/367* (2013.01); *H01L 23/4006* (2013.01);
(Continued)

(58) Field of Classification Search
CPC ............. H01L 23/4006; H01L 23/4838; H01L 23/49575; H01L 2023/405; H01L 2023/4056
See application file for complete search history.

(56) References Cited

U.S. PATENT DOCUMENTS 4,730,235 A * 3/1988 Newton .................. H01L 23/32
257/713
6,381,137 B1 * 4/2002 Kato .................... H01L 23/3677
257/713
(Continued)

FOREIGN PATENT DOCUMENTS

JP   S56-043170 U   4/1981
WO  2018/087800 A1  5/2018

OTHER PUBLICATIONS

An Office Action; "Notice of Reasons for Refusal," mailed by the Japanese Patent Office on Aug. 20, 2024, which corresponds to Japanese Patent Application No. 2021-143130 and is related to U.S. Appl. No. 17/806,205; with English language translation.

*Primary Examiner* — David A Zarneke
(74) *Attorney, Agent, or Firm* — Studebaker Brackett PLLC (57) ABSTRACT

A semiconductor device includes: a semiconductor element; a sealing resin; a gate terminal; a drain terminal; a source terminal; a heat dissipation plate electrically connected to the drain, and protruding from a second side intersecting with a first side of the sealing resin in top view; and a heat dissipation plate electrically connected to the drain, and protruding from a third side opposing the second side of the sealing resin in top view. At least a height position of a lower surface of a distal end portion of the heat dissipation plate and a height position of an upper surface of a proximal end portion of the heat dissipation plate or a height position of a lower surface of a distal end portion of the heat dissipation plate and a height position of an upper surface of a proximal end portion of the heat dissipation plate are the same.

2 Claims, 12 Drawing Sheets

(51) Int. Cl.
*H01L 23/40* (2006.01)
*H01L 23/495* (2006.01)
*H01L 25/11* (2006.01)

(52) U.S. Cl.
CPC ...... *H01L 25/115* (2013.01); *H01L 2023/405* (2013.01); *H01L 2023/4056* (2013.01); *H01L 23/49575* (2013.01)

(56) References Cited

U.S. PATENT DOCUMENTS

| | | | |
|---|---|---|---|
| 7,626,822 B2* | 12/2009 | Ma | H01L 23/4006 165/185 |
| 11,152,287 B2* | 10/2021 | Komo | H01L 25/07 |
| 2019/0252300 A1 | 8/2019 | Komo et al. | |

* cited by examiner

SEMICONDUCTOR DEVICE

BACKGROUND OF THE INVENTION

Field of the Invention

The present disclosure relates to semiconductor devices.

Description of the Background Art

When a plurality of semiconductor devices are connected in parallel, drain terminals of the semiconductor devices have been connected only by substrate patterns, so that a difference in parasitic resistance and parasitic inductance among the substrate patterns is caused, resulting in current imbalance among the semiconductor devices. Furthermore, the semiconductor devices are connected to a heat sink through respective insulating sheets, so that thermal bonding is low, and, in a case where temperatures of the semiconductor devices deviate, the temperature deviations are less likely to be eliminated.

One method to address these problems is a method of connecting heat dissipation plates protruding from laterally opposite sides of each of molding resins when the plurality of semiconductor devices are connected in parallel to suppress current and thermal imbalance among the semiconductor devices.

For example, Japanese Utility Model Application Laid-Open No. 56-43170 discloses a structure of a semiconductor device in which heat dissipation plates protruding from laterally opposite sides of a molding resin have screw holes.

Technology disclosed in Japanese Utility Model Application Laid-Open No. 56-43170, however, does not contemplate connecting a plurality of semiconductor devices in parallel, and the heat dissipation plates are required to be stacked vertically for connection to connect the semiconductor devices in parallel. The semiconductor devices cannot correctly be fixed as they are lifted from attachment positions, and current and thermal imbalance among the semiconductor devices cannot be suppressed.

SUMMARY

It is an object of the present disclosure to provide technology enabling suppression of current and thermal imbalance caused when a plurality of semiconductor devices are connected in parallel.

A semiconductor device according to the present disclosure is a semiconductor device connectable with semiconductor devices arranged on laterally opposite sides thereof. The semiconductor device includes a semiconductor element, a sealing resin, a gate terminal, a drain terminal, a source terminal, a first heat dissipating plate, and a second heat dissipating plate. The semiconductor element allows a current to flow from a source to a drain upon input of a signal from a gate. The sealing resin is rectangular in top view, and seals the semiconductor element. The gate terminal is electrically connected to the gate, and protrudes from a first side of the sealing resin in top view. The drain terminal is electrically connected to the drain, and protrudes from the first side of the sealing resin in top view. The source terminal is electrically connected to the source, and protrudes from the first side of the sealing resin in top view. The first heat dissipation plate is electrically connected to the drain, and protrudes from a second side intersecting with the first side of the sealing resin in top view. The second heat dissipation plate is electrically connected to the drain, and protrudes from a third side opposing the second side of the sealing resin in top view. At least a height position of a lower surface of a distal end portion of the first heat dissipation plate and a height position of an upper surface of a proximal end portion of the second heat dissipation plate or a height position of a lower surface of a distal end portion of the second heat dissipation plate and a height position of an upper surface of a proximal end portion of the first heat dissipation plate are the same.

When a plurality of semiconductor devices are connected in parallel, the first heat dissipation plate and the second heat dissipation plate of the semiconductor device on one of the laterally opposite sides can be connected to adhere to each other, and the second heat dissipation plate and the first heat dissipation plate of the semiconductor device on the other one of the laterally opposite sides can be connected to adhere to each other without lifting the semiconductor devices from attachment positions. Current and thermal imbalance caused when the plurality of semiconductor devices are connected in parallel can thereby be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1A:
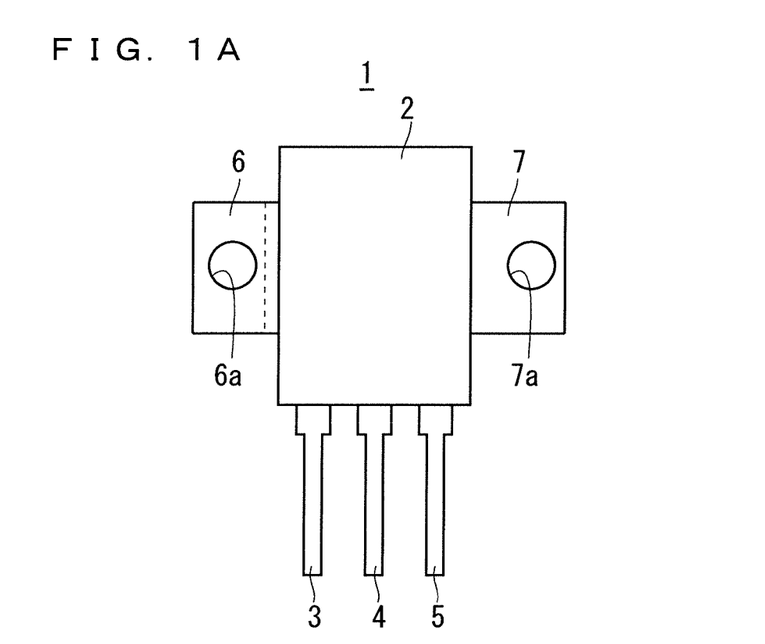
FIGS. 1A and 1B are respectively a top view and a side view of a semiconductor device according to Embodiment 1.
Figure 1B:
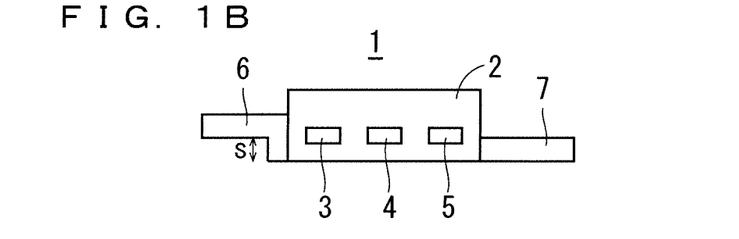
Figure 2A:
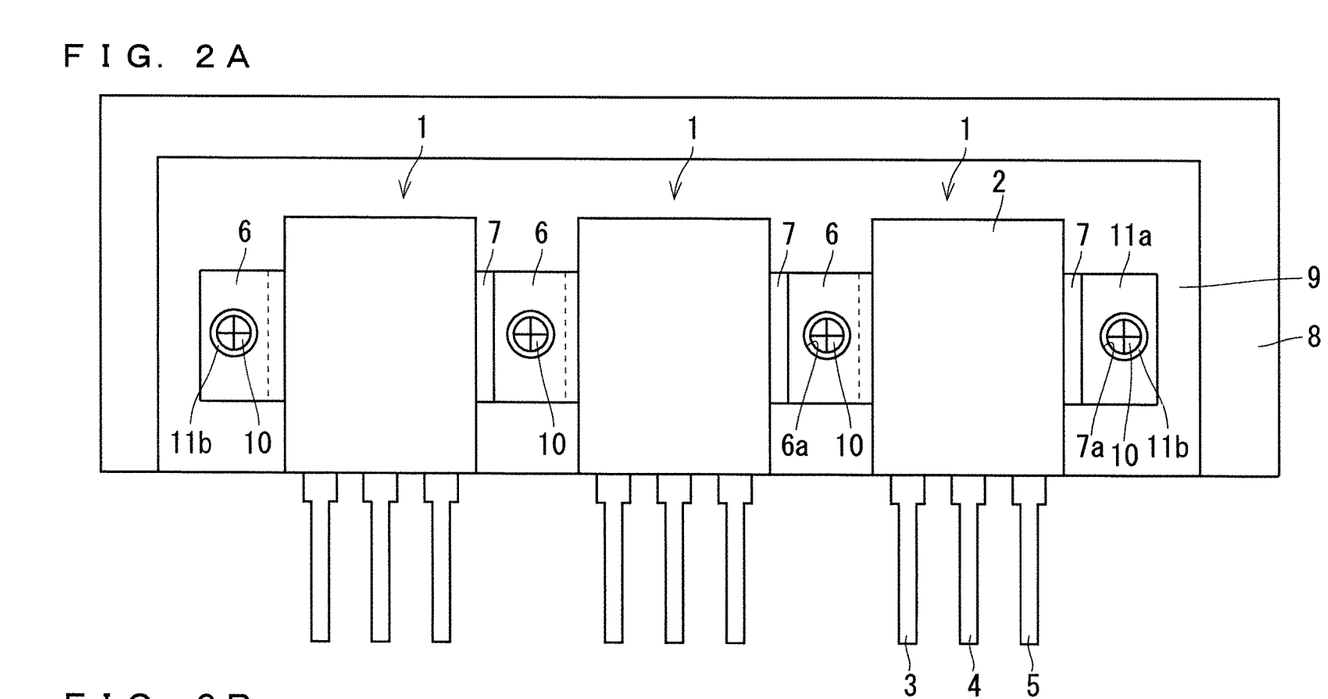
FIGS. 2A and 2B are respectively a top view and a side view of semiconductor devices according to Embodiment 1 connected in parallel.
Figure 2B:
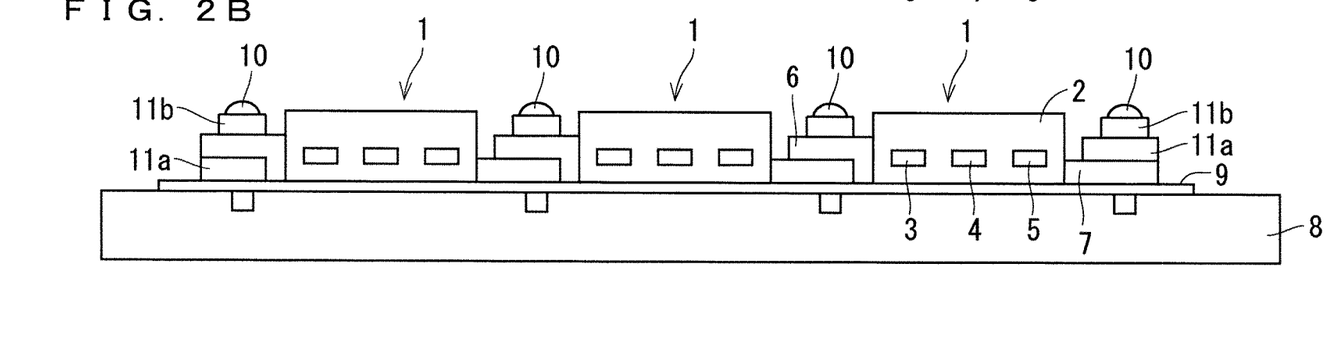

Embodiment 1 will be described below with reference to the drawings. FIG. 1A is a top view of a semiconductor device 1 according to Embodiment 1, and FIG. 1B is a side view of the semiconductor device 1. FIG. 2A is a top view of semiconductor devices 1 according to Embodiment 1 connected in parallel, and FIG. 2B is a side view of the semiconductor devices 1 connected in parallel.

As illustrated in FIGS. 1A and 1B, the semiconductor device 1 is a switching device, and includes a semiconductor element (not illustrated), a sealing resin 2, a gate terminal 3, a drain terminal 4, a source terminal 5, a heat dissipation plate 6 as a first heat dissipation plate, and a heat dissipation plate 7 as a second heat dissipation plate.

The semiconductor element is a semiconductor switching element, and allows a current to flow from a source to a drain upon input of a signal from a gate. The sealing resin 2 is rectangular in top view, and seals the semiconductor element.

The gate terminal 3 is electrically connected to the gate of the semiconductor element, and protrudes from a first side of the sealing resin 2 in top view. The drain terminal 4 is electrically connected to the drain of the semiconductor element, and protrudes from the first side of the sealing resin 2 in top view. The source terminal 5 is electrically connected to the source of the semiconductor element, and protrudes from the first side of the sealing resin 2 in top view.

As illustrated in FIGS. 2A and 2B, the heat dissipation plates 6 and 7 are connected to a heat sink 8 through an insulating sheet 9, and transfer heat generated by the semiconductor element to the heat sink 8. As illustrated in FIGS. 1A and 1B, the heat dissipation plate 6 is electrically connected to the drain of the semiconductor element, and protrudes from a second side intersecting with the first side of the sealing resin 2 in top view. The heat dissipation plate 7 is electrically connected to the drain of the semiconductor element, and protrudes from a third side opposing the second side of the sealing resin 2 in top view. The first side is herein a lower side of the sealing resin 2 in FIG. 1A. The second side is a left side of the sealing resin 2 in FIG. 1A, and the third side is a right side of the sealing resin 2 in FIG. 1A.

The heat dissipation plate 6 is L-shaped in side view by bending a plate-like member made of copper, for example. A proximal end portion of the heat dissipation plate 6 protrudes from the sealing resin 2, and extends upward. A distal end portion of the heat dissipation plate 6 forms a first planar portion provided through a portion bent leftward in FIGS. 1A and 1B from the proximal end portion, and extending leftward. The distal end portion of the heat dissipation plate 6 has a through hole 6a extending from an upper surface to a lower surface.

The heat dissipation plate 7 is formed of a plate-like member made of copper, for example. The heat dissipation plate 7 extends rightward in FIGS. 1A and 1B, and the heat dissipation plate 7 as a whole forms a second planar portion. A distal end portion of the heat dissipation plate 7 has a through hole 7a extending from an upper surface to a lower surface. A proximal end portion of the heat dissipation plate 7 is herein a portion of the heat dissipation plate 7 to the left of the through hole 7a in FIGS. 1A and 1B.

As illustrated in FIGS. 2A and 2B, screws 10 to connect the semiconductor device 1 and semiconductor devices 1 arranged on laterally opposite sides thereof in parallel are inserted into the through holes 6a and 7a. A lateral direction is a left-right direction in FIGS. 2A and 2B, and the same applies to the other drawings.

As illustrated in FIG. 1B, the heat dissipation plate 6 and the heat dissipation plate 7 protrude from the same height position of the sealing resin 2. The heat dissipation plate 6 has a step s between a lower surface of the distal end portion and a lower surface of the proximal end portion, and a height position of the lower surface of the distal end portion of the heat dissipation plate 6 and a height position of an upper surface of the proximal end portion of the heat dissipation plate 7 are the same.

When the plurality of semiconductor devices 1 are connected in parallel over an upper surface of the heat sink 8 through the insulating sheet 9 as illustrated in FIGS. 2A and 2B, in the semiconductor device 1 other than the semiconductor device 1 at the left end and the semiconductor device 1 at the right end, the lower surface of the distal end portion of the heat dissipation plate 6 of the semiconductor device 1 is caused to adhere to the upper surface of the heat dissipation plate 7 of the semiconductor device 1 on one of the laterally opposite sides (a left side), and the upper surface of the heat dissipation plate 7 of the semiconductor device 1 is caused to adhere to the lower surface of the distal end portion of the heat dissipation plate 6 of the semiconductor device 1 on the other one of the laterally opposite sides (a right side). The through hole 6a of the heat dissipation plate 6 and the through hole 7a of the heat dissipation plate 7 communicate in a state of the heat dissipation plate 6 and the heat dissipation plate 7 adhering to each other.

In the semiconductor device 1 at the left end, a spacer 11a is disposed on the lower surface of the distal end portion of the heat dissipation plate 6 to eliminate the step s of the heat dissipation plate 6, that is, a gap between the distal end portion of the heat dissipation plate 6 and the insulating sheet 9, and the spacer 11a is fixed by the screw 10 along with the heat dissipation plate 6. In the semiconductor device 1 at the right end, the spacer 11a is disposed on the upper surface of the heat dissipation plate 7 to cause a height position of the screw 10 used for the heat dissipation plate 7 of the semiconductor device 1 to match height positions of the other screws 10, and the spacer 11a is fixed by the screw 10 along with the heat dissipation plate 7. To insulate the screw 10 and the heat sink 8, the screw 10 is inserted into the through hole 6a of the heat dissipation plate 6, the through hole 7a of the heat dissipation plate 7, and a through hole (not illustrated) of the spacer 11a through a spacer 11b.

Since the height position of the lower surface of the distal end portion of the heat dissipation plate 6 and the height position of the upper surface of the proximal end portion of the heat dissipation plate 7 are the same as described above, the heat dissipation plate 6 and the heat dissipation plate 7 of the semiconductor device 1 on one of the laterally opposite sides (the left side) can be connected to adhere to each other, and the heat dissipation plate 7 and the heat dissipation plate 6 of the semiconductor device 1 on the other one of the laterally opposite sides (the right side) can be connected to adhere to each other without lifting the semiconductor devices 1 from attachment positions.

A state in which the height position of the lower surface of the distal end portion of the heat dissipation plate 6 and the height position of the upper surface of the proximal end portion of the heat dissipation plate 7 are the same includes not only a state in which they are exactly the same but also a state in which they are slightly different due to a manufacturing error and the like.

As described above, the semiconductor device 1 according to Embodiment 1 is the semiconductor device 1 connectable with the semiconductor devices 1 arranged on laterally opposite sides thereof, and including: the semiconductor element to allow the current to flow from the source to the drain upon input of the signal from the gate; the sealing resin 2 being rectangular in top view and to seal the semiconductor element; the gate terminal 3 electrically connected to the gate, and protruding from the first side of the sealing resin 2 in top view; the drain terminal 4 electrically connected to the drain, and protruding from the first side of the sealing resin 2 in top view; the source terminal 5 electrically connected to the source, and protruding from the first side of the sealing resin 2 in top view; the heat dissipation plate 6 electrically connected to the drain, and protruding from the second side intersecting with the first side of the sealing resin 2 in top view; and the heat dissipation plate 7 electrically connected to the drain, and protruding from the third side opposing the second side of the sealing resin 2 in top view. At least the height position of the lower surface of the distal end portion of the heat dissipation plate 6 and the height position of the upper surface of the proximal end portion of the heat dissipation plate 7 or the height position of the lower surface of the distal end portion of the heat dissipation plate 7 and the height position of the upper surface of the proximal end portion of the heat dissipation plate 6 are the same.

Specifically, the heat dissipation plate 6 and the heat dissipation plate 7 protrude from the same height position of the sealing resin 2, the distal end portion of the heat dissipation plate 6 includes the first planar portion, the proximal end portion of the heat dissipation plate 7 includes the second planar portion, the first planar portion is provided through the portion bent laterally from the proximal end portion of the heat dissipation plate 6 protruding from the sealing resin 2 and extending upward, and the height position of the lower surface of the first planar portion and the height position of the upper surface of the second planar portion are the same.

Thus, when the plurality of semiconductor devices 1 are connected in parallel, the heat dissipation plate 6 and the heat dissipation plate 7 of the semiconductor device 1 on one of the laterally opposite sides (the left side) can be connected to adhere to each other, and the heat dissipation plate 7 and the heat dissipation plate 6 of the semiconductor device 1 on the other one of the laterally opposite sides (the right side) can be connected to adhere to each other without lifting the semiconductor devices 1 from the attachment positions. Current and thermal imbalance caused when the semiconductor devices 1 are connected in parallel can thereby be suppressed.

Since the heat dissipation plate 6 and the heat dissipation plate 7 protrude from the same height position of the sealing resin 2, the semiconductor device 1 can more easily be manufactured compared with a case where they protrude from different height positions.

The distal end portion of the heat dissipation plate 6 and the distal end portion of the heat dissipation plate 7 respectively have the through hole 6a and the through hole 7a each extending from the upper surface to the lower surface. The heat dissipation plate 6 and the heat dissipation plate 7 can thereby easily be connected by the screw 10.

Although the heat dissipation plate 6 has the step s by being bent in Embodiment 1, the heat dissipation plate 6 and the heat dissipation plate 7 may protrude from different height positions of the sealing resin 2 to have the step between the lower surface of the heat dissipation plate 6 and the upper surface of the heat dissipation plate 7.

The heat dissipation plate 6 and the heat dissipation plate 7 may not necessarily have the through hole 6a and the through hole 7a, respectively, as long as the heat dissipation plate 6 and the heat dissipation plate 7 can be connected. In this case, the heat dissipation plate 6 and the heat dissipation plate 7 may be connected by soldering, pressure welding, or the like.

Embodiment 2

Figure 3:
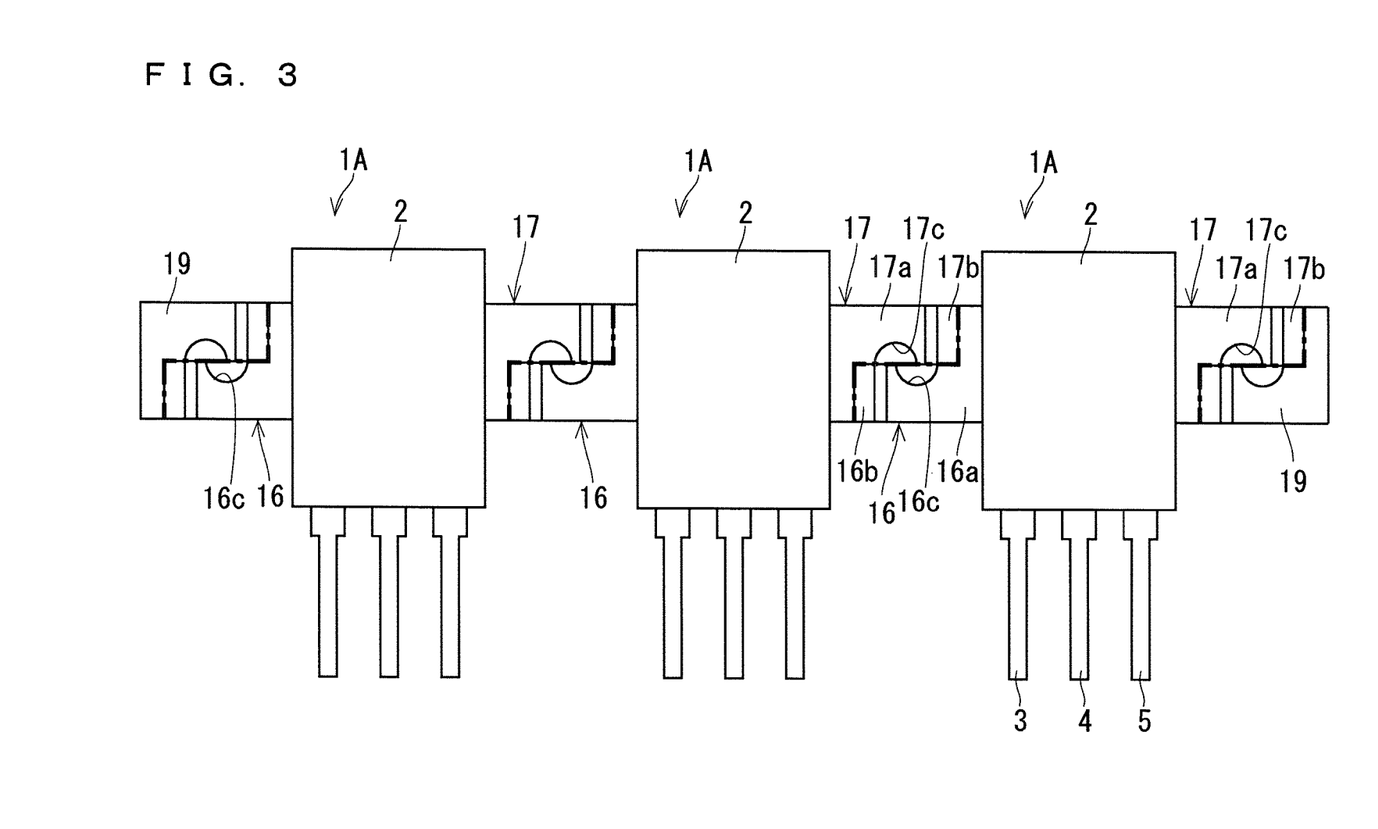
FIG. 3 is a top view of semiconductor devices according to Embodiment 2 before frame cutting.
Figure 4A:
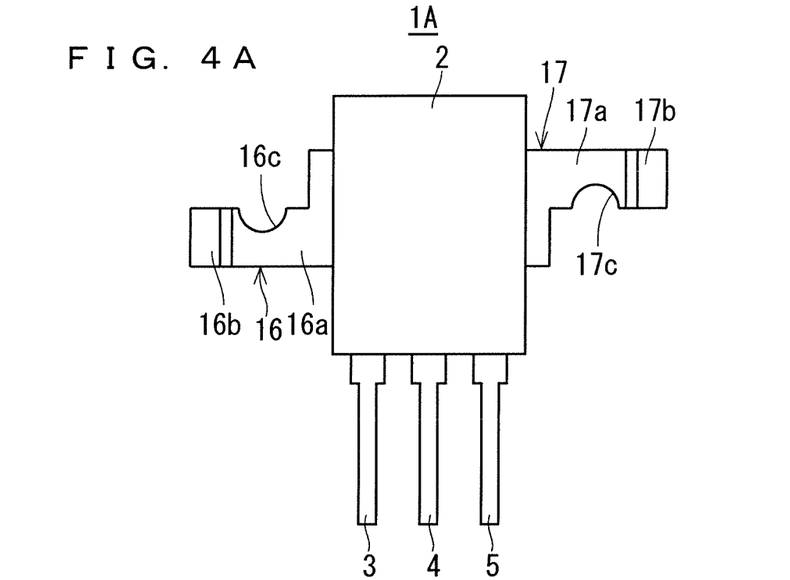
FIGS. 4A and 4B are respectively a top view and a side view of a semiconductor device according to Embodiment 2 after frame cutting.
Figure 4B:
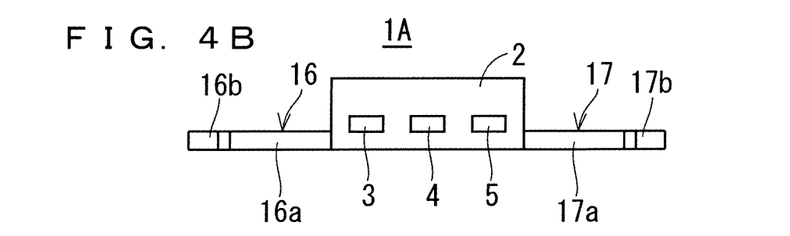
Figure 5A:
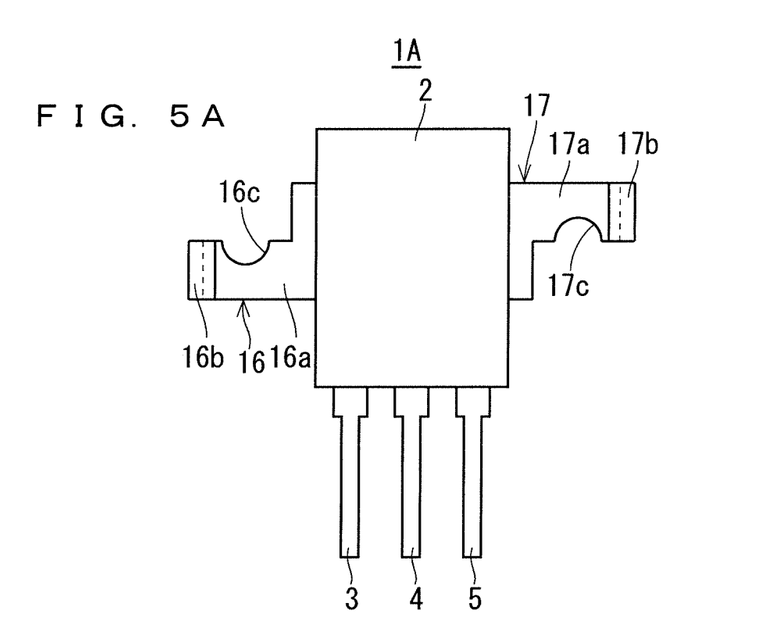
FIGS. 5A and 5B are respectively a top view and a side view of the semiconductor device according to Embodiment 2 after forming.
Figure 5B:
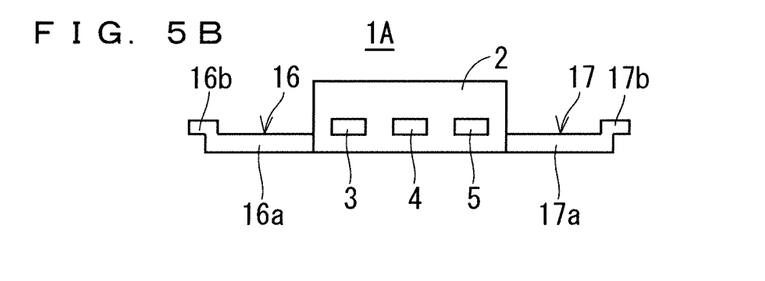
Figures 6A, 6B:
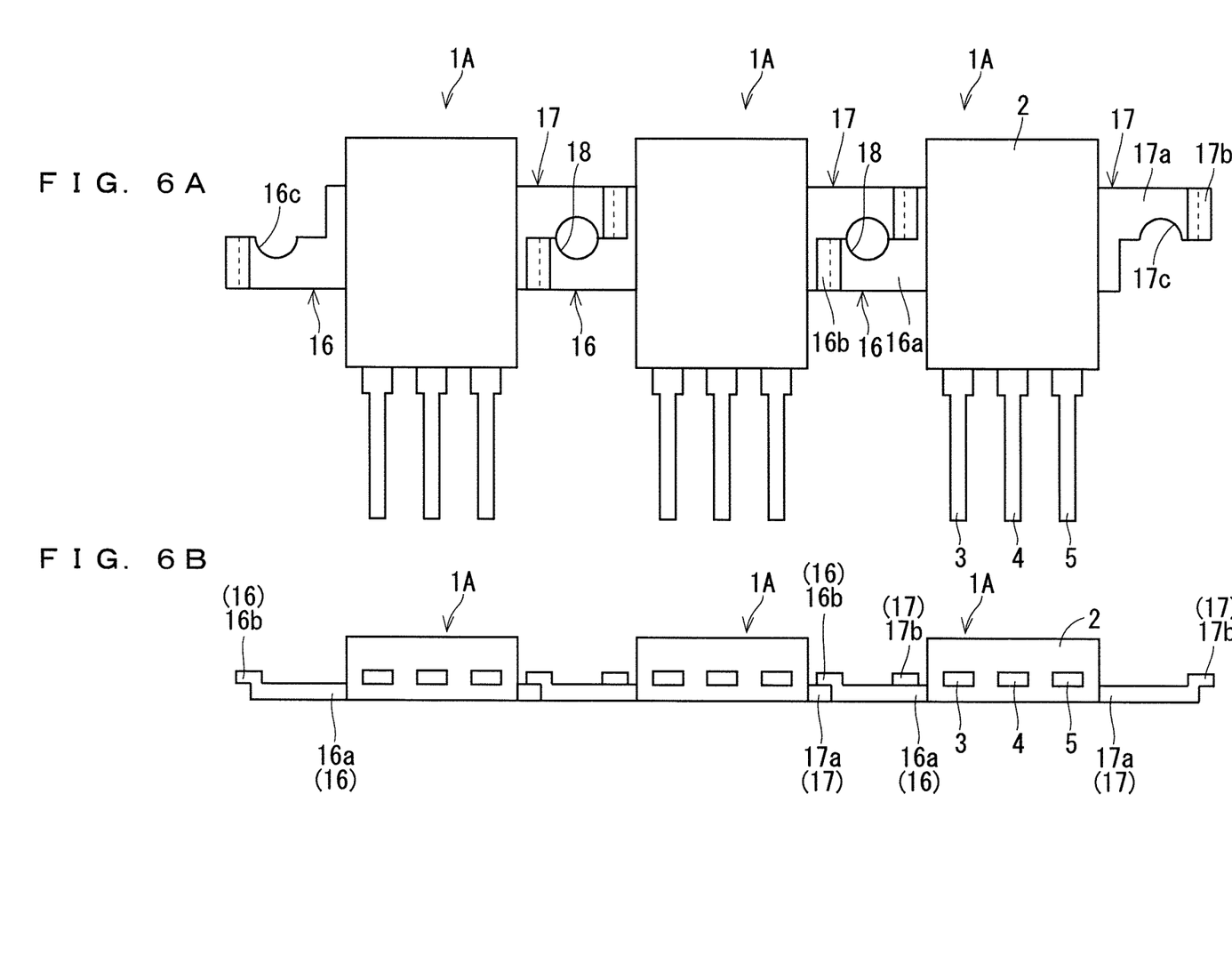
FIGS. 6A and 6B are respectively a top view and a side view of the semiconductor devices according to Embodiment 2 combined in parallel.
Figure 7A:
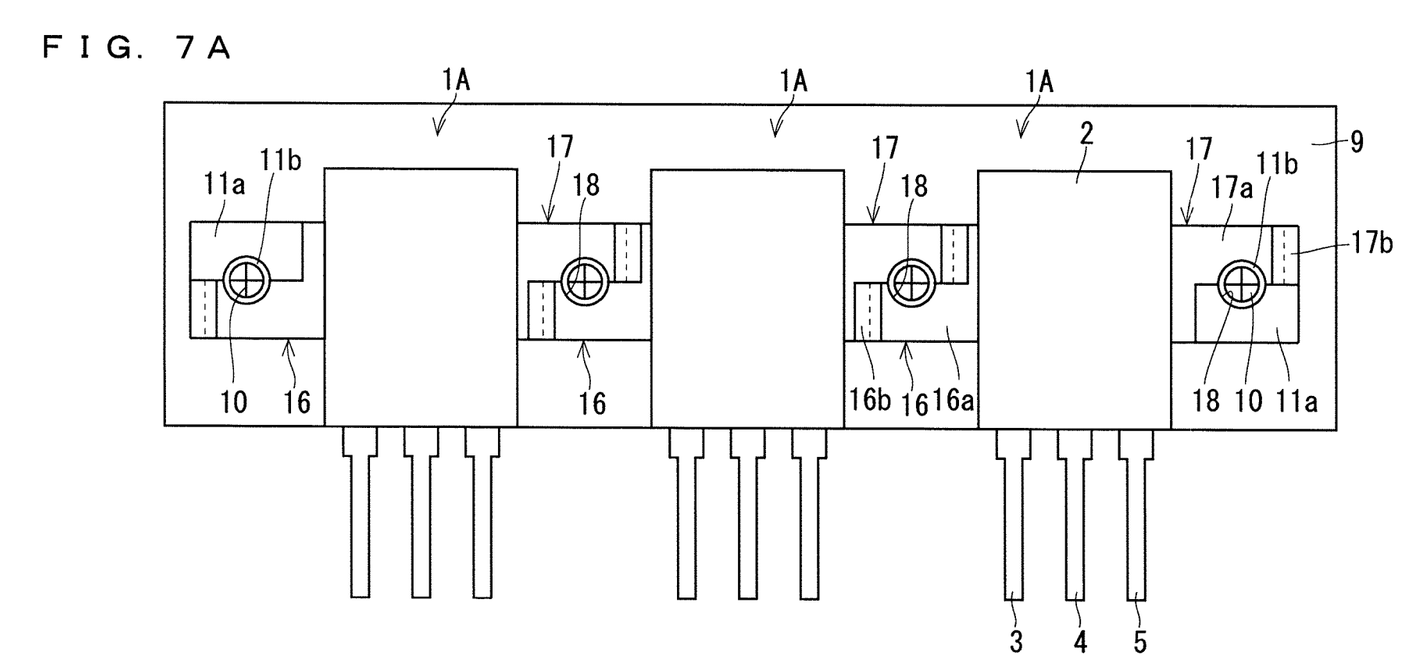
FIGS. 7A and 7B are respectively a top view and a side view of the semiconductor devices according to Embodiment 2 connected in parallel.
Figure 7B:
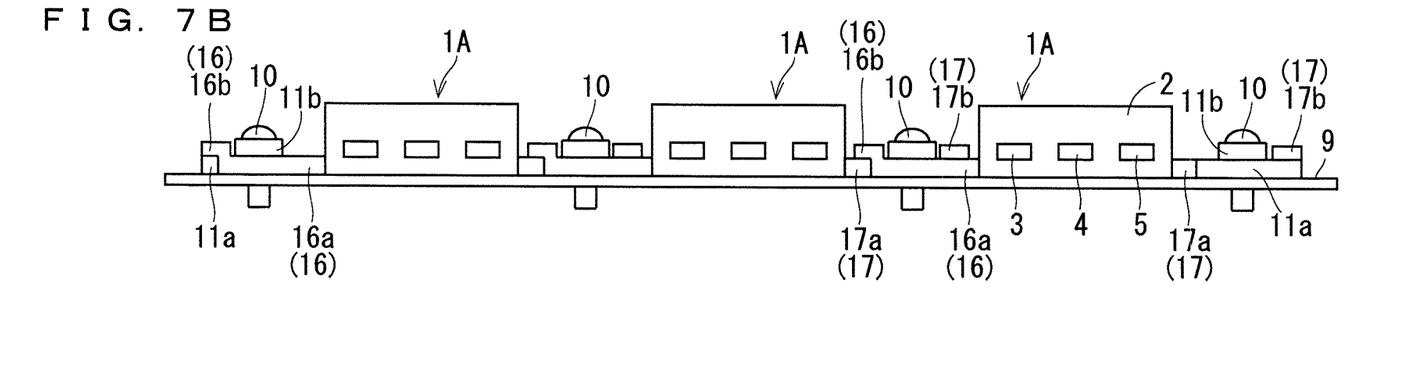

A semiconductor device 1A according to Embodiment 2 will be described next. FIG. 3 is a top view of semiconductor devices 1A according to Embodiment 2 before frame cutting. FIG. 4A is a top view of the semiconductor device 1A according to Embodiment 2 after frame cutting, and FIG. 4B is a side view of the semiconductor device 1A after frame cutting. FIG. 5A is a top view of the semiconductor device 1A according to Embodiment 2 after forming, and FIG. 5B is a side view of the semiconductor device 1A after forming. FIG. 6A is a top view of the semiconductor devices 1A according to Embodiment 2 combined in parallel, and FIG. 6B is a side view of the semiconductor devices 1A combined in parallel. FIG. 7A is a top view of the semiconductor devices 1A according to Embodiment 2 connected in parallel, and FIG. 7B is a side view of the semiconductor devices 1A connected in parallel. The heat sink is not illustrated in FIGS. 7A and 7B. In Embodiment 2, the same components as those described in Embodiment 1 bear the same reference signs as those of the components described in Embodiment 1, and description thereof is omitted.

As illustrated in FIGS. 5A and 5B, in Embodiment 2, the semiconductor device 1A includes a heat dissipation plate 16 as the first heat dissipation plate and a heat dissipation plate 17 as the second heat dissipation plate in place of the heat dissipation plate 6 and the heat dissipation plate 7.

The heat dissipation plate 16 and the heat dissipation plate 17 are each L-shaped to have a proximal end portion and a distal end portion narrower than the proximal end portion in top view. The heat dissipation plate 16 and the heat dissipation plate 17 each have a step protruding upward by bending a plate-like member made of copper, for example, and protrude from the same height position of the sealing resin 2.

The heat dissipation plate 16 includes a first planar portion 16a, a first anchoring portion 16b, and a cutout 16c. The first planar portion 16a is formed in a portion of the heat dissipation plate 16 except for the distal end portion, that is, a portion of the heat dissipation plate 16 including the proximal end portion, and the first anchoring portion 16b is formed in the distal end portion of the heat dissipation plate 16, and is located above the first planar portion 16a through the step. An inner periphery of the first planar portion 16a has the cutout 16c extending from an upper surface to a lower surface and being semicircular in top view. The proximal end portion of the heat dissipation plate 16 is herein a portion of the heat dissipation plate 16 to the right of the cutout 16c in FIGS. 5A and 5B.

The heat dissipation plate 17 includes a second planar portion 17a, a second anchoring portion 17b, and a cutout 17c. The second planar portion 17a is formed in a portion of the heat dissipation plate 17 except for the distal end portion, that is, a portion of the heat dissipation plate 17 including the proximal end portion, and the second anchoring portion 17b is formed in the distal end portion of the heat dissipation plate 17, and is located above the second planar portion 17a through the step. An inner periphery of the second planar portion 17a has the cutout 17c extending from an upper surface to a lower surface and being semicircular in top view. The proximal end portion of the heat dissipation plate 17 is herein a portion of the heat dissipation plate 17 to the left of the cutout 17c in FIGS. 5A and 5B.

The heat dissipation plate 16 and the heat dissipation plate 17 have point symmetry about the sealing resin 2 in top view. Furthermore, a height position of a lower surface of the first anchoring portion 16b of the heat dissipation plate 16 and a height position of an upper surface of the second planar portion 17a of the heat dissipation plate 17 are the same, and a height position of a lower surface of the second anchoring portion 17b of the heat dissipation plate 17 and a height position of an upper surface of the first planar portion 16a of the heat dissipation plate 16 are the same.

Thus, as illustrated in FIGS. 6A and 6B, the first anchoring portion 16b of the heat dissipation plate 16 is engageable with the second planar portion 17a of the heat dissipation plate 17 of the semiconductor device 1A on one of the laterally opposite sides (the left side), and the second anchoring portion 17b of the heat dissipation plate 17 is engageable with the first planar portion 16a of the heat dissipation plate 16 of the semiconductor device 1A on the other one of the laterally opposite sides (the right side).

A state in which the height position of the lower surface of the first anchoring portion 16b of the heat dissipation plate 16 and the height position of the upper surface of the second planar portion 17a of the heat dissipation plate 17 are the same, and the height position of the lower surface of the second anchoring portion 17b of the heat dissipation plate 17 and the height position of the upper surface of the first planar portion 16a of the heat dissipation plate 16 are the same includes not only a state in which they are exactly the same but also a state in which they are slightly different due to a manufacturing error and the like.

A procedure for forming the heat dissipation plate 16 and the heat dissipation plate 17 and a procedure for connecting the semiconductor devices 1A will be described next. As illustrated in FIG. 3, the plurality of semiconductor devices 1A are formed to be integrated in parallel before frame cutting. The heat dissipation plates 16 and the heat dissipation plates 17 are formed in a state of the heat dissipation plate 16 and the heat dissipation plate 17 of adjacent semiconductor devices 1A being integrated. In this case, the heat dissipation plate 16 of the semiconductor device 1A at the left end and the heat dissipation plate 17 of the semiconductor device 1A at the right end in FIG. 3 are integrated with unnecessary portions 19 to be cut in frame cutting.

When frame cutting is performed along alternate long and short dash lines in FIG. 3, the semiconductor devices 1A are individually divided as illustrated in FIGS. 4A and 4B. In this case, the heat dissipation plate 16 and the heat dissipation plate 17 have no steps, and the heat dissipation plate 16 and the heat dissipation plate 17 as a whole are planar. When forming is performed, the first anchoring portion 16b and the second anchoring portion 17b are formed like steps as illustrated in FIGS. 5A and 5B.

Next, when the plurality of semiconductor devices 1A are combined in parallel as illustrated in FIGS. 6A and 6B, the lower surface of the first anchoring portion 16b of the heat dissipation plate 16 of the semiconductor device 1A and the upper surface of the second planar portion 17a of the heat dissipation plate 17 of the semiconductor device 1A on one of the laterally opposite sides (the left side) are engaged to adhere to each other, and the upper surface of the first planar portion 16a of the heat dissipation plate 16 of the semiconductor device 1A and the lower surface of the second anchoring portion 17b of the heat dissipation plate 17 of the semiconductor device 1A on one of the laterally opposite sides (the left side) are engaged to adhere to each other. The cutout 16c of the heat dissipation plate 16 and the cutout 17c of the heat dissipation plate 17 form a through hole 18 (corresponding to a first through hole) in top view in this state.

Furthermore, the lower surface of the second anchoring portion 17b of the heat dissipation plate 17 of the semiconductor device 1A and the upper surface of the first planar portion 16a of the heat dissipation plate 16 of the semiconductor device 1A on the other one of the laterally opposite sides (the right side) are engaged to adhere to each other, and the upper surface of the second planar portion 17a of the heat dissipation plate 17 of the semiconductor device 1A and the lower surface of the first anchoring portion 16b of the heat dissipation plate 16 of the semiconductor device 1A on the other one of the laterally opposite sides (the right side) are engaged to adhere to each other. The cutout 17c of the heat dissipation plate 17 and the cutout 16c of the heat dissipation plate 16 form a through hole 18 (corresponding to a second through hole) in top view in this state.

Next, as illustrated in FIGS. 7A and 7B, in the semiconductor device 1A at the left end, the spacer 11a having a cutout (not illustrated) is disposed in a recessed portion of the L-shape of the heat dissipation plate 16 to form the through hole 18, and the spacer 11a is fixed by the screw 10 along with the heat dissipation plate 16. In the semiconductor device 1A at the right end, the spacer 11a having a cutout (not illustrated) is disposed in a recessed portion of the L-shape of the heat dissipation plate 17 to form the through hole 18, and the spacer 11a is fixed by the screw 10 along with the heat dissipation plate 17. To insulate the screw 10 and the heat sink (not illustrated), the screw 10 is inserted into the through hole 18 through the spacer 11b.

As described above, in the semiconductor device 1A according to Embodiment 2, the heat dissipation plate 16 and the heat dissipation plate 17 protrude from the same height position of the sealing resin 2, the proximal end portion and the distal end portion of the heat dissipation plate 16 respectively include the first planar portion 16a and the first anchoring portion 16b, the proximal end portion and the distal end portion of the heat dissipation plate 17 respectively include the second planar portion 17a and the second anchoring portion 17b, the height position of the lower surface of the first anchoring portion 16b and the height position of the upper surface of the second planar portion 17a are the same, and the height position of the lower surface of the second anchoring portion 17b and the height position of the upper surface of the first planar portion 16a are the same.

Thus, when the plurality of semiconductor devices 1A are connected in parallel, the heat dissipation plate 16 and the heat dissipation plate 17 of the semiconductor device 1A on one of the laterally opposite sides (the left side) can be connected to adhere to each other, and the heat dissipation plate 17 and the heat dissipation plate 16 of the semiconductor device 1A on the other one of the laterally opposite sides (the right side) can be connected to adhere to each other without lifting the semiconductor devices 1A from attachment positions. Current and thermal imbalance caused when the semiconductor devices 1A are connected in parallel can thereby be suppressed.

The heat dissipation plate 16 and the heat dissipation plate 17 are each L-shaped to have the proximal end portion and the distal end portion narrower than the proximal end portion in top view, the heat dissipation plate 16 has point symmetry with the heat dissipation plate 17 about the sealing resin 2 in top view, the first anchoring portion 16b of the heat dissipation plate 16 is engageable with the second planar portion 17a of the heat dissipation plate 17 of the semiconductor device 1A on one of the laterally opposite sides, and the second anchoring portion 17b of the heat dissipation plate 17 is engageable with the first planar portion 16a of the heat dissipation plate 16 of the semiconductor device 1A on the other one of the laterally opposite sides.

The heat dissipation plate 16 and the heat dissipation plate 17 can more rigidly be connected than those in Embodiment 1.

The first planar portion 16a and the second planar portion 17a respectively have the cutout 16c and the cutout 17c each extending from the upper surface to the lower surface and being semicircular in top view, the cutouts 16c and 17c form the through hole 18 being circular in top view in a state of the heat dissipation plate 16 and the heat dissipation plate 17 of the semiconductor device 1A on one of the laterally opposite sides (the left side) being engaged, and the cutouts 16c and 17c form the through hole 18 being circular in top view in a state of the heat dissipation plate 17 and the heat dissipation plate 16 of the semiconductor device 1A on the other one of the laterally opposite sides (the right side) being engaged. The heat dissipation plate 16 and the heat dissipation plate 17 can thereby easily be connected by the screw 10.

The heat dissipation plate 16 and the heat dissipation plate 17 may not necessarily have the cutout 16c and the cutout 17c, respectively, as long as the heat dissipation plate 16 and the heat dissipation plate 17 can be connected. In this case, the heat dissipation plate 16 and the heat dissipation plate 17 may be connected by soldering, pressure welding, or the like.

Embodiment 3

Figure 8:
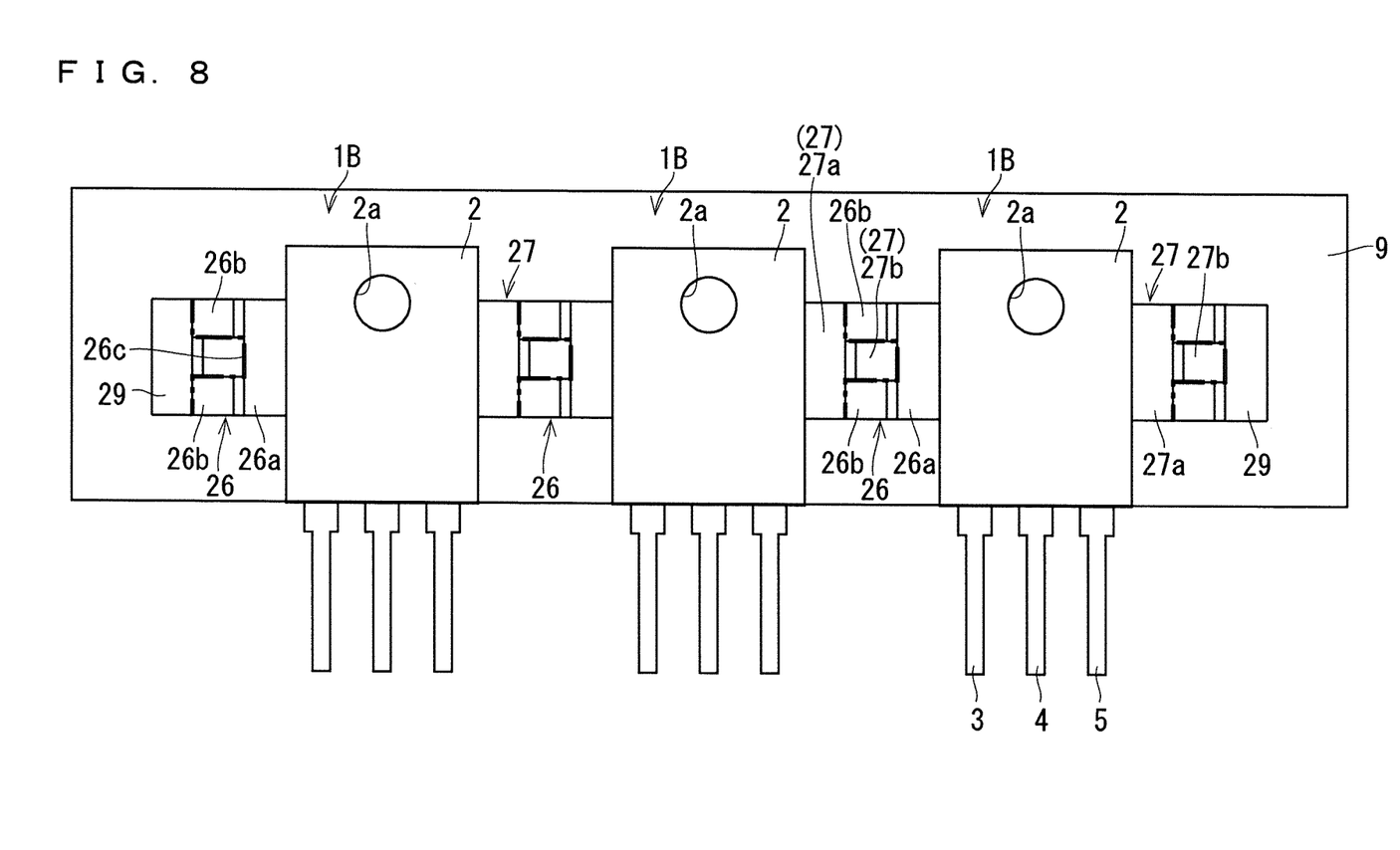
FIG. 8 is a top view of semiconductor devices according to Embodiment 3 before frame cutting.
Figure 9A:
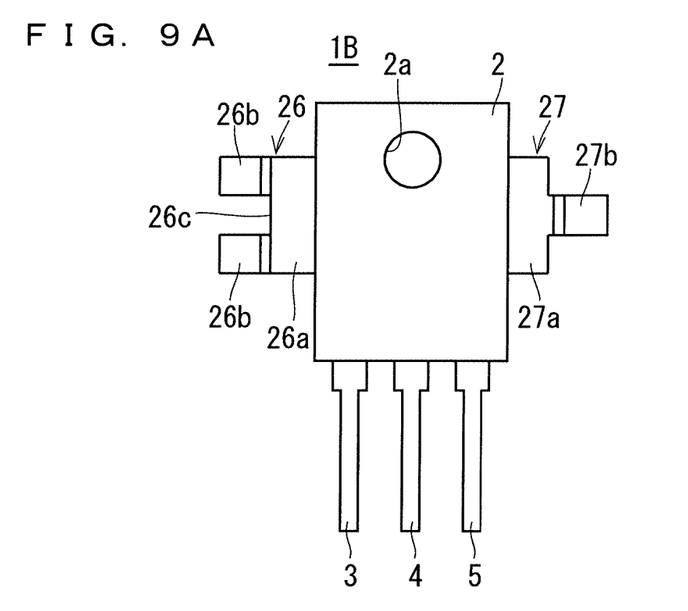
FIGS. 9A and 9B are respectively a top view and a side view of a semiconductor device according to Embodiment 3 after frame cutting.
Figure 9B:
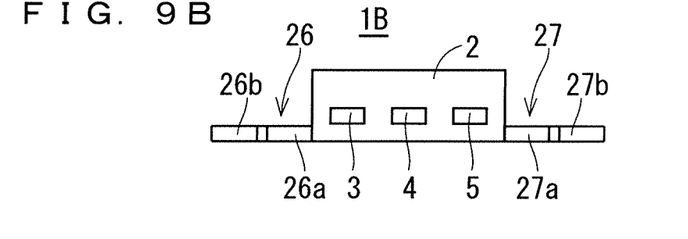
Figure 10A:
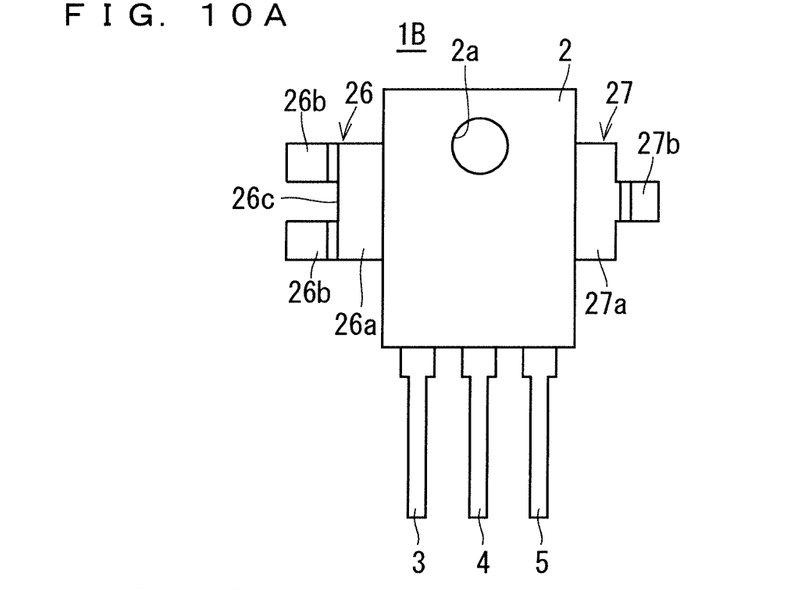
FIGS. 10A and 10B are respectively a top view and a side view of the semiconductor device according to Embodiment 3 after forming.
Figure 10B:
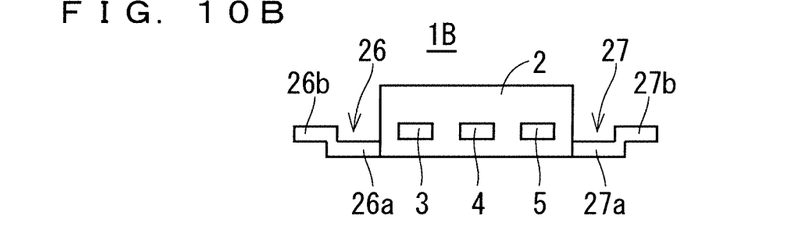
Figure 11A:
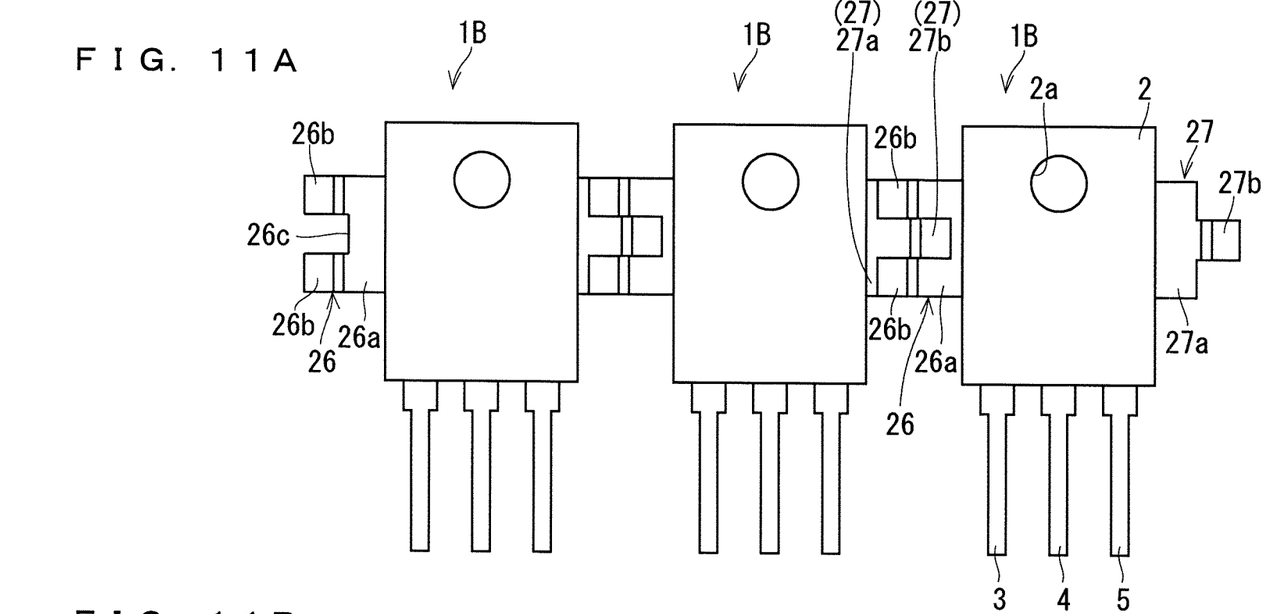
FIGS. 11A and 11B are respectively a top view and a side view of the semiconductor devices according to Embodiment 3 combined in parallel.
Figure 11B:
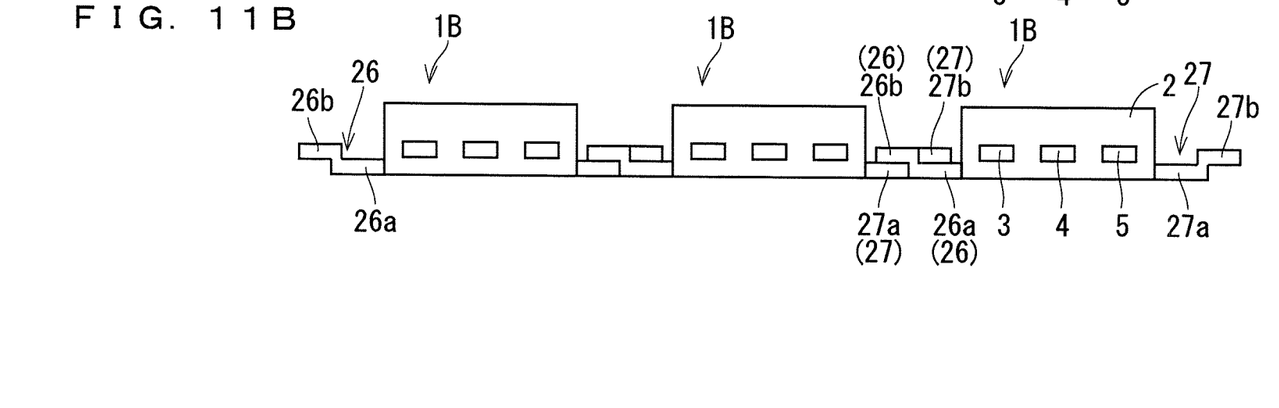
Figure 12A:
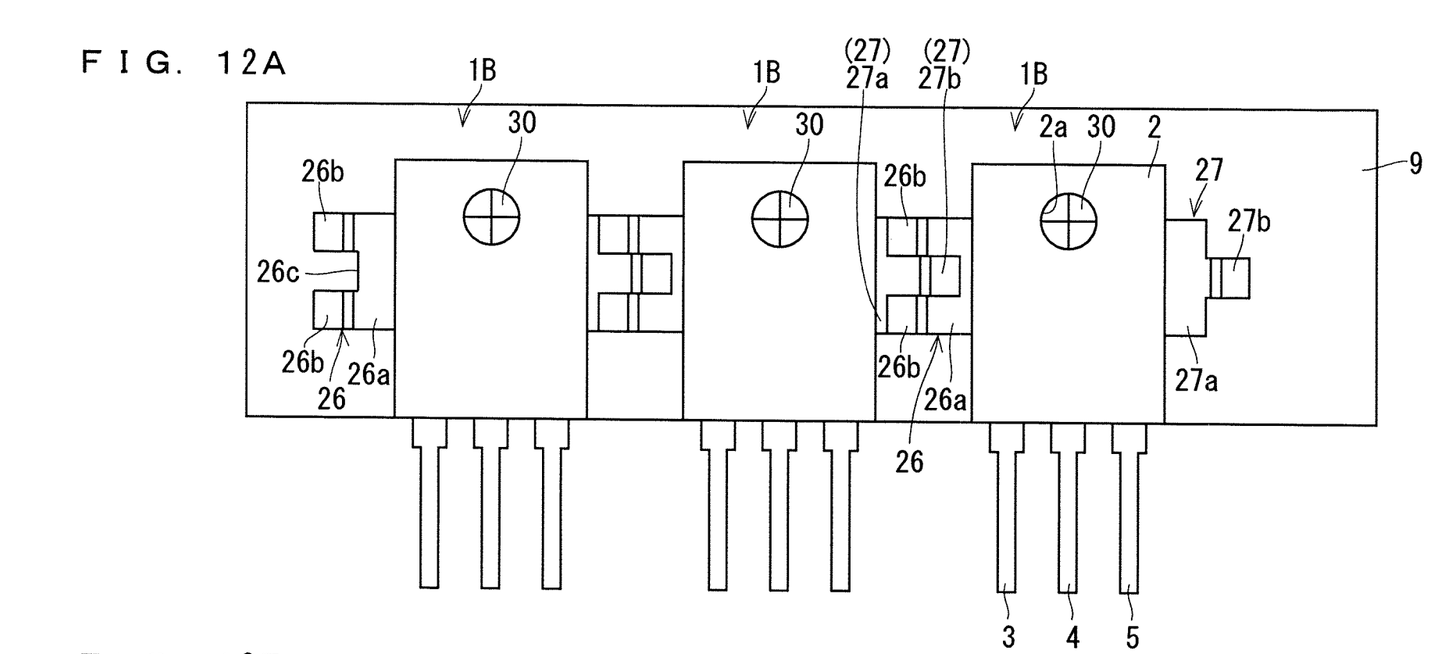
FIGS. 12A and 12B are respectively a top view and a side view of the semiconductor devices according to Embodiment 3 connected in parallel.
Figure 12B:
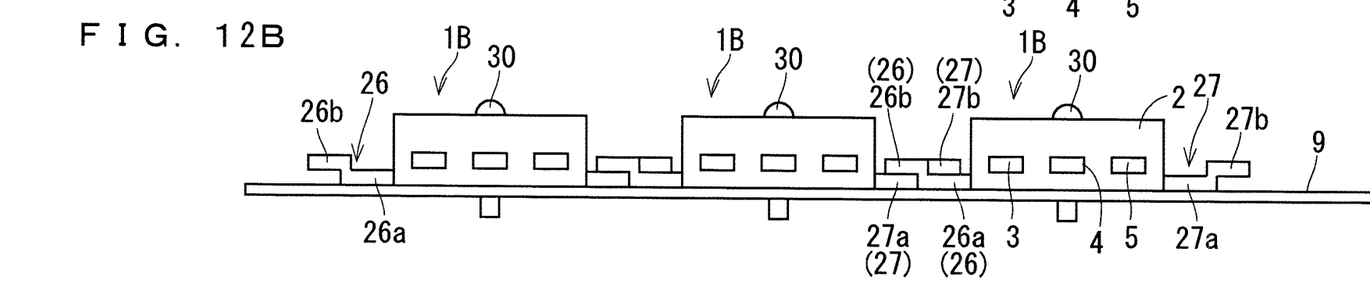

A semiconductor device 1B according to Embodiment 3 will be described next. FIG. 8 is a top view of semiconductor devices 1B according to Embodiment 3 before frame cutting. FIG. 9A is a top view of the semiconductor device 1B according to Embodiment 3 after frame cutting, and FIG. 9B is a side view of the semiconductor device 1B after frame cutting. FIG. 10A is a top view of the semiconductor device 1B according to Embodiment 3 after forming, and FIG. 10B is a side view of the semiconductor device 1B after forming. FIG. 11A is a top view of the semiconductor devices 1B according to Embodiment 3 combined in parallel, and FIG. 11B is a side view of the semiconductor devices 1B combined in parallel. FIG. 12A is a top view of the semiconductor devices 1B according to Embodiment 3 connected in parallel, and FIG. 12B is a side view of the semiconductor devices 1B connected in parallel. The heat sink is not illustrated in FIGS. 12A and 12B. In Embodiment 3, the same components as those described in Embodiments 1 and 2 bear the same reference signs as those of the components described in Embodiments 1 and 2, and description thereof is omitted.

As illustrated in FIGS. 10A and 10B, in Embodiment 3, the semiconductor device 1B includes a heat dissipation plate 26 as the first heat dissipation plate and a heat dissipation plate 27 as the second heat dissipation plate in place of the heat dissipation plate 6 and the heat dissipation plate 7.

The heat dissipation plate 26 and the heat dissipation plate 27 each have a step protruding upward by bending a plate-like member made of copper, for example, and protrude from the same height position of the sealing resin 2.

The heat dissipation plate 26 includes a first planar portion 26a and a pair of first anchoring portions 26b. The first planar portion 26a is formed in a proximal end portion of the heat dissipation plate 26. The pair of first anchoring portions 26b is formed in a distal end portion of the heat dissipation plate 26, and is located above the first planar portion 26a through the step. A clearance 26c is formed between the pair of first anchoring portions 26b.

The heat dissipation plate 27 includes a second planar portion 27a and a second anchoring portion 27b. The second planar portion 27a is formed in a proximal end portion of the heat dissipation plate 27. The second anchoring portion 27b is formed in a distal end portion of the heat dissipation plate 27, and is located above the second planar portion 27a through the step. The second anchoring portion 27b is formed in the middle along the width of the heat dissipation plate 27, and is sized to pass through the clearance 26c of the heat dissipation plate 26 of another semiconductor device 1B and adhere to an upper surface of the first planar portion 26a.

Height positions of lower surfaces of the pair of first anchoring portions 26b of the heat dissipation plate 26 and a height position of an upper surface of the second planar portion 27a of the heat dissipation plate 27 are the same, and a height position of a lower surface of the second anchoring portion 27b of the heat dissipation plate 27 and a height position of an upper surface of the first planar portion 26a of the heat dissipation plate 26 are the same.

Thus, as illustrated in FIGS. 11A and 11B, the pair of first anchoring portions 26b of the heat dissipation plate 26 is engageable with the second planar portion 27a of the heat dissipation plate 27 of the semiconductor device 1B on one of the laterally opposite sides (the left side), and the second anchoring portion 27b of the heat dissipation plate 27 is engageable with the first planar portion 26a of the heat dissipation plate 26 of the semiconductor device 1B on the other one of the laterally opposite sides (the right side).

A state in which the height positions of the lower surfaces of the pair of first anchoring portions 26b of the heat dissipation plate 26 and the height position of the upper surface of the second planar portion 27a of the heat dissipation plate 27 are the same, and the height position of the lower surface of the second anchoring portion 27b of the heat dissipation plate 27 and the height position of the upper surface of the first planar portion 26a of the heat dissipation plate 26 are the same includes not only a state in which they are exactly the same but also a state in which they are slightly different due to a manufacturing error and the like.

An inner periphery of the sealing resin 2 has a threaded hole 2a extending from an upper surface to a lower surface in top view.

A procedure for forming the heat dissipation plate 26 and the heat dissipation plate 27 and a procedure for connecting the semiconductor devices 1B will be described next. As illustrated in FIG. 8, the plurality of semiconductor devices 1B are formed to be integrated in parallel before frame cutting. The heat dissipation plates 26 and the heat dissipation plates 27 are formed in a state of the heat dissipation plate 26 and the heat dissipation plate 27 of adjacent semiconductor devices 1B being integrated. In this case, the heat dissipation plate 26 of the semiconductor device 1B at the left end and the heat dissipation plate 27 of the semiconductor device 1B at the right end in FIG. 8 are integrated with unnecessary portions 29 to be cut in frame cutting.

When frame cutting is performed along alternate long and short dash lines in FIG. 8, the semiconductor devices 1B are individually divided as illustrated in FIGS. 9A and 9B. In this case, the heat dissipation plate 26 and the heat dissipation plate 27 have no steps, the heat dissipation plate 26 and the heat dissipation plate 27 as a whole are planar. When forming is performed, the first anchoring portions 26b and the second anchoring portion 27b are formed like steps as illustrated in FIGS. 10A and 10B.

Next, when the plurality of semiconductor devices 1B are combined in parallel as illustrated in FIGS. 11A and 11B, the lower surfaces of the pair of first anchoring portions 26b of the heat dissipation plate 26 of the semiconductor device 1B and the upper surface of the second planar portion 27a of the heat dissipation plate 27 of the semiconductor device 1B on one of the laterally opposite sides (the left side) are engaged to adhere to each other, and the upper surface of the first planar portion 26a of the heat dissipation plate 26 of the semiconductor device 1B and the lower surface of the second anchoring portion 27b of the heat dissipation plate 27 of the semiconductor device 1B on one of the laterally opposite sides (the left side) are engaged to adhere to each other.

Furthermore, the lower surface of the second anchoring portion 27b of the heat dissipation plate 27 of the semiconductor device 1B and the upper surface of the first planar portion 26a of the heat dissipation plate 26 of the semiconductor device 1B on the other one of the laterally opposite sides (the right side) are engaged to adhere to each other, and the upper surface of the second planar portion 27a of the heat dissipation plate 27 of the semiconductor device 1B and the lower surfaces of the pair of first anchoring portions 26b of the heat dissipation plate 26 of the semiconductor device 1B on the other one of the laterally opposite sides (the right side) are engaged to adhere to each other.

Next, as illustrated in FIGS. 12A and 12B, a screw 30 is threadedly engaged with the threaded hole 2a of the sealing resin 2, and the semiconductor devices 1B are fixed to the upper surface of the heat sink (not illustrated) through the insulating sheet 9 in a state of being combined in parallel.

As described above, in the semiconductor device 1B according to Embodiment 3, the heat dissipation plate 26 and the heat dissipation plate 27 protrude from the same height position of the sealing resin 2, the proximal end portion and the distal end portion of the heat dissipation plate 26 respectively include the first planar portion 26a and the first anchoring portions 26b, the proximal end portion and the distal end portion of the heat dissipation plate 27 respectively include the second planar portion 27a and the second anchoring portion 27b, the height positions of the lower surfaces of the first anchoring portions 26b and the height position of the upper surface of the second planar portion 27a are the same, and the height position of the lower surface of the second anchoring portion 27b and the height position of the upper surface of the first planar portion 26a are the same.

Thus, when the plurality of semiconductor devices 1B are connected in parallel, the heat dissipation plate 26 and the heat dissipation plate 27 of the semiconductor device 1B on one of the laterally opposite sides (the left side) can be connected to adhere to each other, and the heat dissipation plate 27 and the heat dissipation plate 26 of the semiconductor device 1B on the other one of the laterally opposite sides (the right side) can be connected to adhere to each other without lifting the semiconductor devices 1B from attachment positions. Current and thermal imbalance caused when the semiconductor devices 1B are connected in parallel can thereby be suppressed.

Since the inner periphery of the sealing resin 2 has the threaded hole 2a in top view, the semiconductor devices 1B can be fixed to the upper surface of the heat sink (not illustrated) without using the spacers 11a and 11b used in Embodiments 1 and 2. The number of parts used when the plurality of semiconductor devices 1B are connected in parallel can thereby be reduced.

The inner periphery of the sealing resin 2 may have the threaded hole 2a not only in Embodiment 3 but also in Embodiments 1 and 2.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device connectable with semiconductor devices arranged on laterally opposite sides thereof, the semiconductor device comprising:
    a semiconductor element to allow a current to flow from a source to a drain upon input of a signal from a gate;
    a sealing resin to seal the semiconductor element, the sealing resin being rectangular in top view;
    a gate terminal electrically connected to the gate, and protruding from a first side of the sealing resin in top view;
    a drain terminal electrically connected to the drain, and protruding from the first side of the sealing resin in top view;
    a source terminal electrically connected to the source, and protruding from the first side of the sealing resin in top view;
    a first heat dissipation plate electrically connected to the drain, and protruding from a second side intersecting with the first side of the sealing resin in top view; and
    a second heat dissipation plate electrically connected to the drain, and protruding from a third side opposing the second side of the sealing resin in top view, wherein
    at least a height position of a lower surface of a distal end portion of the first heat dissipation plate and a height position of an upper surface of a proximal end portion of the second heat dissipation plate or a height position of a lower surface of a distal end portion of the second heat dissipation plate and a height position of an upper surface of a proximal end portion of the first heat dissipation plate are the same,
    the first heat dissipation plate and the second heat dissipation plate protrude from the same height position of the sealing resin,
    the distal end portion of the first heat dissipation plate includes a first planar portion,
    the proximal end portion of the second heat dissipation plate includes a second planar portion,
    the first planar portion is provided through a portion bent laterally from the proximal end portion of the first heat dissipation plate protruding from the sealing resin and extending upward, and
    a height position of a lower surface of the first planar portion and a height position of an upper surface of the second planar portion are the same.

2. The semiconductor device according to claim 1, wherein
    the first planar portion and the second planar portion each have a through hole extending from an upper surface to a lower surface.

* * * * *